(12) United States Patent
Koo

(10) Patent No.: US 7,678,534 B2
(45) Date of Patent: Mar. 16, 2010

(54) MASK FOR FORMING LANDING PLUG CONTACT HOLE AND PLUG FORMING METHOD USING THE SAME

(75) Inventor: Dong Chul Koo, Seongnam (KR)

(73) Assignee: Hynix Semiconductor Inc., Icheon-si (KR)

( * ) Notice: Subject to any disclaimer, the term of this patent is extended or adjusted under 35 U.S.C. 154(b) by 844 days.

(21) Appl. No.: 11/149,629

(22) Filed: Jun. 10, 2005

(65) Prior Publication Data

US 2006/0134859 A1   Jun. 22, 2006

(30) Foreign Application Priority Data

Dec. 16, 2004   (KR) ...................... 10-2004-0107371

(51) Int. Cl.
  *G03F 7/20*   (2006.01)
(52) U.S. Cl. ...................................... 430/311
(58) Field of Classification Search ................. 430/311, 430/314
See application file for complete search history.

(56) References Cited

U.S. PATENT DOCUMENTS

| | | | |
|---|---|---|---|
| 6,187,627 B1 * | 2/2001 | Chen et al. | ................... 438/253 |
| 6,472,303 B1 | 10/2002 | Weon et al. | |
| 2003/0216030 A1 * | 11/2003 | Kim et al. | ................... 438/629 |

FOREIGN PATENT DOCUMENTS

| KR | 2001-0095943 | 11/2001 |
|---|---|---|
| KR | 2004-0050535 | 6/2004 |

* cited by examiner

*Primary Examiner*—Sin J. Lee
*Assistant Examiner*—Brittany Raymond
(74) *Attorney, Agent, or Firm*—Marshall, Gerstein & Borun LLP

(57) ABSTRACT

Disclosed herein are a mask for forming a landing plug contact hole to vertically expose an active region of a semiconductor substrate to a bit line or storage node contact, and a plug forming method using the same. Through the use of the crescent-shaped masks, it is possible to increase the critical dimension at a lower end of the resultant contact hole in contact with an active region of a semiconductor substrate, thereby enabling exposure of a wider area of the active region to be connected with the bit line or storage node contact.

4 Claims, 3 Drawing Sheets

MASK FOR FORMING LANDING PLUG CONTACT HOLE AND PLUG FORMING METHOD USING THE SAME

BACKGROUND OF THE INVENTION

1. Field of The Invention

The present invention relates to a method for forming plugs of a semiconductor devices, and more particularly, to a mask for forming a landing plug contact hole to vertically expose an active region of a semiconductor substrate to a bit line or storage node contact, and a plug forming method using the same.

2. Description of the Related Art

Recently, as design rules for semiconductor devices become smaller and the semiconductor devices become integrated with higher density, the size of the memory cells is gradually decreasing.

Achieving such a high-density integration of semiconductor devices requires vast studies of novel materials associated with lithography, cell structure and wiring, and of physical property limits associated with insulation layers, etc. In addition, there exists a need to gradually decrease the critical dimension (CD) of a bit line or storage node contact.

FIG. 1 is a plan view illustrating a mask pattern for forming landing plug contact holes in accordance with the prior art.

Referring to FIG. 1, a semiconductor substrate includes device active regions 10 and device inactive regions 12. A plurality of lines, i.e. gate electrodes 14, are formed on the semiconductor substrate at a constant interval. In this case, the active regions 10 between the gate electrodes 14 form contact areas e and f to be connected with bit lines or storage node contacts. In the prior art, as shown in FIG. 1, I-shaped linear masks 16 are used to form landing plug contact holes to expose contact areas e and f of the active regions 10 to the bit lines or storage node contacts.

FIG. 2 is a vertical sectional view illustrating the arrangement of landing plugs, bit lines and storage node contacts embedded in inter-insulation layers in accordance with the prior art. Now, a prior art method for forming bit lines and storage node contacts based on landing plugs embedded in contact holes of an inter-insulation layer will be explained with reference to FIG. 2.

In the prior art method, first, each device active region 10 of the semiconductor substrate is etched in a shallow trench isolation (STI) manner to form an associated device in the active region 12 as a device isolation layer is embedded in the resultant trench. Then, a cell transistor, including the gate electrodes 14, is formed on the semiconductor substrate, and a first inter-insulation layer 18 is formed to cover the overall upper surface of the semiconductor substrate formed with the cell transistor. The first inter-insulation layer 18, for example, is formed of an undoped silicate glass (USG) layer, boro phospho silicate glass (BPSG) layer, or the like.

The first inter-insulation layer 18, supported on the bottom semiconductor substrate, is etched by means of the I-shaped linear masks 16, thereby forming contact holes to expose the contact areas e and f of the active regions 10 between the gate electrodes 14.

Then, the contact holes of the first inter-insulation layer 18 are gap-filled with doped poly-silicon to form a conductive layer, and the resultant conductive layer is flattened by means of chemical mechanical polishing (CMP), etc. In this way, the first inter-insulation layer 18 is provided with landing plugs 24 embedded in the contact holes to be vertically connected to the bit lines or storage node contacts.

Subsequently, a second inter-insulation layer 28 is deposited on the first inter-insulation layer 18, and is partially etched to form bit line contact holes (not-shown) for the interconnection of the semiconductor substrate and bit lines. Thereby, each multi-layer bit line 26 is formed on an upper surface of the second inter-insulation layer 28 by, for example, stacking a barrier metallic layer 26a, a bit line metallic layer 26b and a hard mask 26c in sequence, and patterning the same. After completing formation of the bit line 26, a third inter-insulation layer 30 is deposited on the overall upper surface of the second inter-insulation layer 28 to cover the bit line 26. The third inter-insulation layer 30, for forming storage node contacts, is formed of a boro-phospho silicate glass (BPSG) layer, high density plasma (HDP) oxide layer, or the like.

The third inter-insulation layer 30 is partially etched to form contact holes to be connected with the landing plugs 24 located there below. Then, the contact holes of the third inter-insulation layer 30 are gap-filled with doped poly-silicon to form a conductive layer, and the resultant conductive layer is flattened by means of chemical mechanical polishing, or the like, thereby forming storage node contacts 32 in the third inter-insulation layer 30. The resultant upper portion is provided with a storage node etching stop layer 34 and a sacrificial insulation layer 36 in sequence. Here, the sacrificial insulation layer 36, for example, is formed of a silicon nitride layer, or silicon oxide layer.

Subsequently, both the storage node etching stop layer 34 and the sacrificial insulation layer 36 are partially etched to form storage node receiving openings. The storage node receiving openings are embedded with doped poly-silicon to form a conductive layer, and the resultant conductive layer is flattened by means of chemical mechanical polishing or other etching processes, thereby forming storage node electrodes 38.

One problem of the prior art semiconductor device configured as stated above is that, due to the etching slope, each landing plug 24, to vertically connect each active region with an associated bit line or storage node contact, has an insufficiently narrow critical dimension (CD) at the lower surface thereof in contact with the active region of the semiconductor substrate, although it has a wide critical dimension at its upper surface which is in contact with the second inter-insulation layer 28. As a result, as clearly explained in FIG. 2, if the active region 10 between both the adjacent inactive regions 12 has a width A, the landing plug 24 comes into contact with the active region 10 only over a width C, while a width B remains is in a non-contact state.

Another problem of the prior art is that, in the etching of landing plug contact holes using the prior art I-shaped linear masks, the contact holes associated with the bit lines are aligned linearly with the other contact holes associated with the storage node contacts, thereby causing only approximately 60% of the overall surface area of the contact holes to be exposed to the active regions. In this case, the contact holes for the bit lines occupy the remaining 40% of the area.

If the landing plug contact holes associated with the bit lines or storage node contacts are inaccurately etched to be exposed to the inactive regions of the semiconductor substrate, it inevitably results in defective contact between the active regions of the semiconductor substrate and the bit lines or storage node contacts, making it impossible to achieve a desired threshold voltage margin of a cell transistor and cause current leakage.

SUMMARY OF THE INVENTION

Therefore, the present invention has been made in view of the above problems, and it is an object of the present invention to provide a crescent-shaped mask for forming a landing plug contact hole, which can increase the critical dimension of the contact hole that is embedded with a landing plug to be vertically connected to a bit line or storage node contact.

It is another object of the present invention to provide a method for forming plugs of semiconductor devices, wherein contact holes, to be embedded with landing plugs, are etched by means of crescent-shaped masks, so as to expose wider active regions of a semiconductor substrate that will be vertically connected to the bit lines or storage node contacts via the landing plugs.

In accordance with one aspect of the present invention, the above and other objects can be accomplished by the provision of a mask for forming landing plug contact holes to vertically expose active regions of a semiconductor substrate to the bit lines or storage node contacts, wherein the mask has a crescent bowed shape such that one of the contact holes, associated with a bit line, is offset from the other contact holes, located at opposite sides thereof and associated with the storage node contacts, at a distance.

In accordance with another aspect of the present invention, the above and other objects can be accomplished by the provision of a method of forming landing plugs in an inter-insulation layer comprising the steps of forming the inter-insulation layer throughout an upper surface of a semiconductor substrate where certain semiconductor diodes are defined, forming contact holes in the inter-insulation layer by means of crescent shaped masks to vertically expose active regions of the semiconductor substrate to bit lines or storage node contacts, and gap-filling a conductive layer in the landing plug contact holes and flattening the conductive layer, thereby forming landing plugs for embedding the contact holes to vertically connect the active regions with the bit lines or storage node contacts.

Preferably, each of the masks may have a crescent bowed shape such that one of the contact holes, associated with a bit line, is offset from the other contact holes, located at opposite sides thereof and associated with the storage node contacts, by a distance.

Preferably, after forming the landing plug contact holes, the inter-insulation layer may be washed to increase a critical dimension of each landing plug contact hole.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
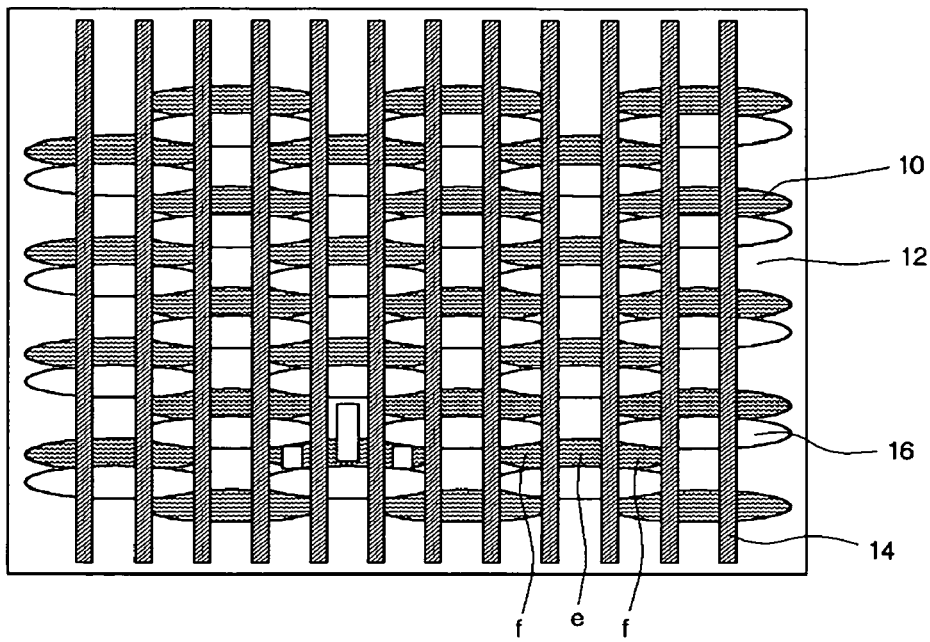
FIG. 1 is a plan view illustrating a mask pattern for forming landing plug contact holes in accordance with the prior art.
Figure 2:
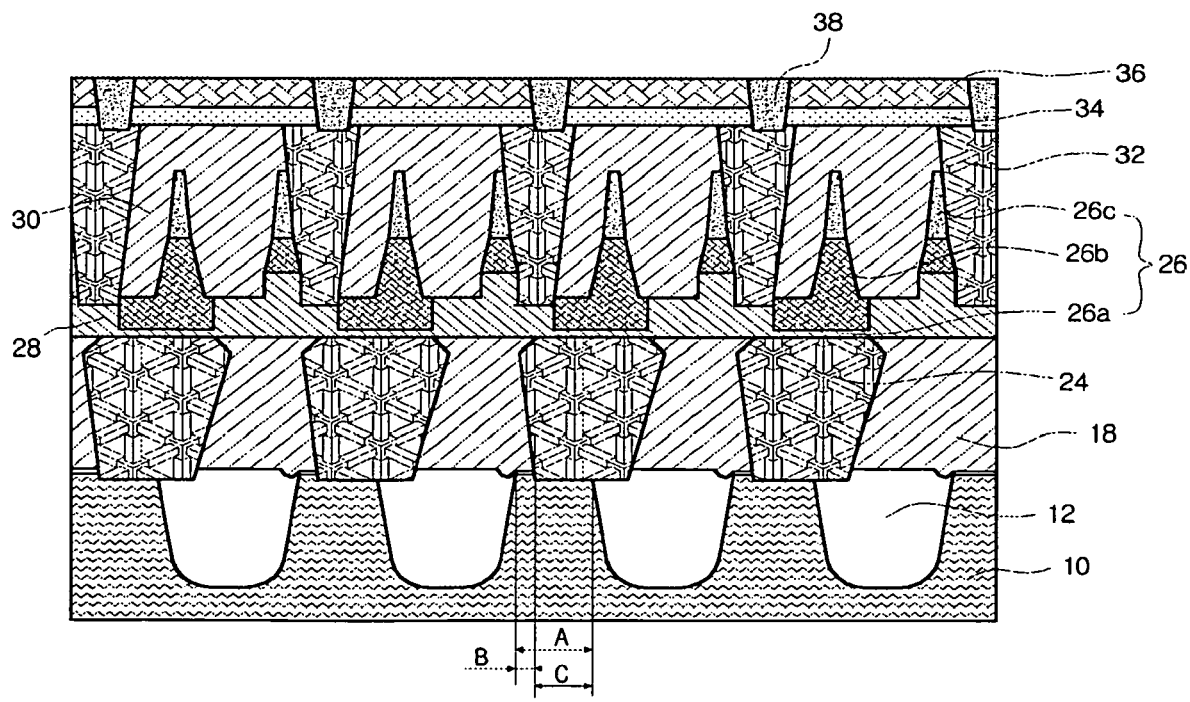
FIG. 2 is a vertical sectional view illustrating the arrangement of landing plugs, bit lines and storage node contacts embedded in the inter-insulation layers in accordance with the prior art.

Now, a preferred embodiment of the present invention will be explained in detail to be easily understood by those skilled in the art with reference of the accompanying drawings.

In the drawings, thicknesses of respective layers and regions are exaggerated for clarity of understanding, and like reference numerals refer to like elements throughout.

Figure 3:
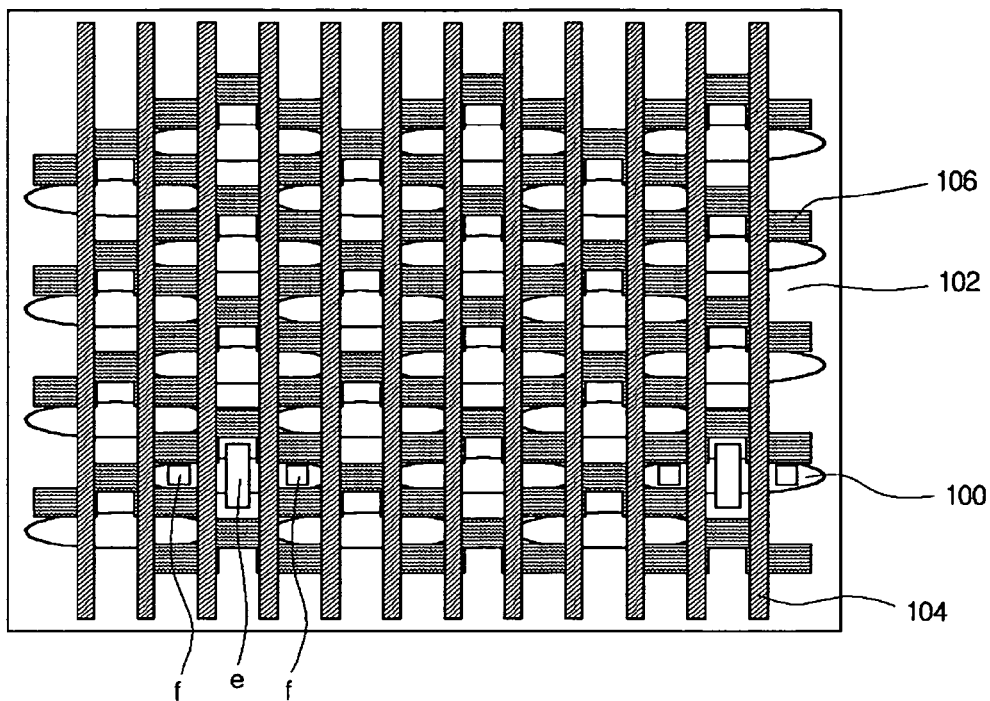
FIG. 3 is a plan view illustrating a mask pattern for forming landing plug contact holes in accordance with an embodiment of the present invention.

FIG. 3 is a plan view illustrating a mask pattern for forming landing plug contact holes in accordance with an embodiment of the present invention.

As shown in FIG. 3, a semiconductor substrate, including device active regions 100 and device inactive regions 102, is prepared. The semiconductor substrate is provided with a cell transistor including a plurality of lines, i.e. gate electrodes 104. An inter-insulation layer (not shown) covers the overall upper surface of the semiconductor substrate formed with the cell transistor. The active regions 10 between the gate electrodes 104 form contact areas e and f to be connected with the bit lines or storage node contacts.

Figure 4:
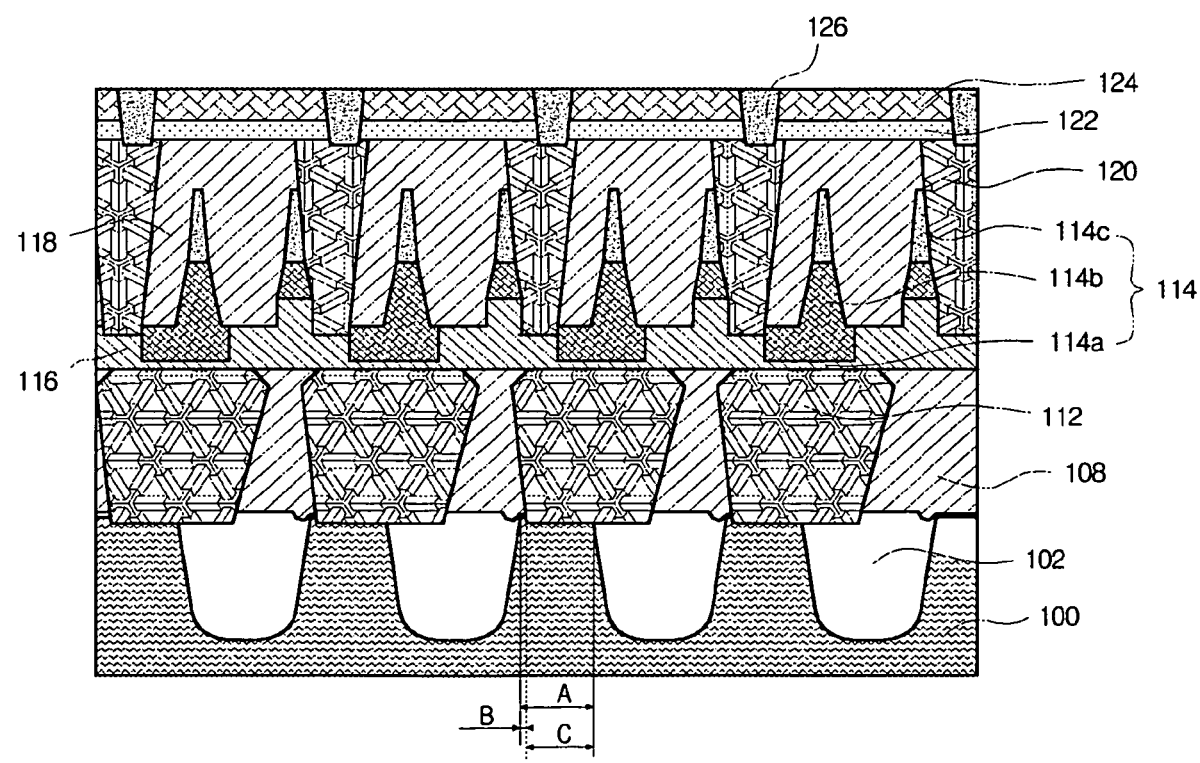
FIG. 4 is a vertical sectional view illustrating the arrangement of the landing plugs, bit lines and storage node contacts embedded in inter-insulation layers in accordance with the embodiment of the present invention.
Figure 5:
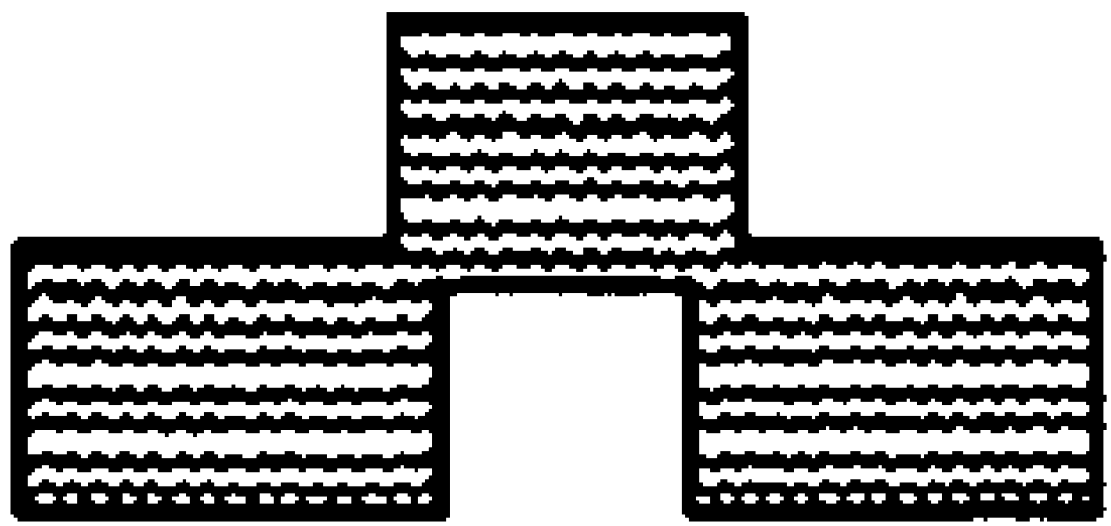
FIG. 5 is a schematic view of a mask for forming a landing plug contact hole in accordance with the embodiment of the present invention.

In the embodiment of the present invention, masks 106, used to form landing plug contact holes to expose the contact areas e and f of the active regions to bit lines or storage node contacts, have a crescent bowed shape (See. FIG. 5), different from the prior art I-shaped linear mask. With such a crescent bowed shape, the resultant contact hole, to be connected with a bit line, is offset from the other contact holes at opposite sides thereof to be connected with storage node contacts, at a certain distance. This enables each contact hole to be widely etched with a desired critical dimension even if the contact hole is etched so as to slope in a vertical direction thereof FIG. 4 is a vertical sectional view illustrating the arrangement of landing plugs, bit lines and storage node contacts embedded in respective inter-insulation layers in accordance with the embodiment of the present invention.

Now, a method for forming bit lines and storage node contacts based on landing plugs embedded in contact holes of an inter-insulation layer according to the present invention will be explained with reference to FIG. 4.

First, each device active region 100 of a semiconductor substrate is etched in a shallow trench isolation (STI) manner to form an associated one of the device inactive regions 102 as a device isolation layer is embedded in the resultant trench. Then, a cell transistor is formed on the semiconductor substrate. A first inter-insulation layer 108 is deposited to cover the overall surface of the semiconductor substrate formed with the cell transistor. The first inter-insulation layer 108, for example, is formed of an undoped silicate glass (USG) layer, boro-phospho silicate glass (BPSG) layer, tetra-ethoxy-silane (TEOS) layer, or the like, and has a thickness of 30000 Å.

Then, a photoresist is applied to an upper surface of the first inter-insulation layer 108, and a photo process is performed by making use of the crescent-shaped bowed masks 106 as shown in FIG. 3. Thereby, the first inter-insulation layer 108 is provided with a mask pattern for defining respective crescent-shaped landing plug areas to be connected with the bit lines or storage node contacts.

Based on the pattern, the first inter-insulation layer 108 is etched to form landing plug contact holes to expose the contact areas e and f (FIG. 3) of the active regions 100 to bit lines or storage node contacts. In this case, different from the prior art, where the contact holes are aligned linearly, the respective landing plug contact holes are arranged such that a contact hole, to be connected with a bit line, is offset from contact holes at opposite sides thereof to be connected with storage node contacts, by a certain distance, thereby defining a bowed structure. As a result, in the case of the landing plug contact hole etched in the inter-insulation layer, a lower end thereof is wider than a lower end of the prior art landing plug contact hole, resulting in an increased critical dimension.

Preferably, after completing the etching of the landing plug contact holes, the first inter-insulation layer 108 is washed in order to increase the critical dimension in the lower end of the landing plug contact hole.

In succession, the contact holes of the first inter-insulation layer 108 are gap-filled with doped poly-silicon to form a conductive layer, and the resulting conductive layer is flattened by means of chemical mechanical polishing (CMP) or the like. In this way, landing plugs 112 are formed in the first inter-insulation layer 108 so as to be vertically connected to the bit lines or storage node contacts.

Subsequently, a second inter-insulation layer 116 is deposited on the first inter-insulation layer 108, and is partially etched to form bit line contact holes (not shown) for the interconnection of the semiconductor substrate and bit lines.

A plurality of multi-layer bit lines 114 are formed on the resultant upper surface of the second inter-insulation layer 116 by, for example, stacking a barrier metallic layer 114a, a bit line metallic layer 114b and a hard mask 114c in sequence, and patterning the same. Then, a third inter-insulation layer 118 is deposited on the overall upper surface of the second inter-insulation layer 116 to cover the bit lines 114. The third inter-insulation layer 118, for forming storage node contacts, is formed of a boro-phospho silicate glass (BPSG) layer, a high density plasma (HDP) oxide layer, or the like.

The second and third inter-insulation layers 116 and 118 are partially etched to form contact holes to expose the landing plugs 112 located there below. Then, the contact holes of the second and third inter-insulation layers 116 and 118 are gap-filled with doped poly-silicon to form a conductive layer, and the resultant conductive layer is flattened by means of chemical mechanical polishing (CMP), or the like, forming storage node contacts 120. After that, the resultant upper portion is provided with a storage node etching stop layer 122 and a sacrificial insulation layer 124 in sequence. Here, the sacrificial insulation layer 124, for example, is formed of a silicon nitride layer, silicon oxide layer, or the like.

Both the storage node etching stop layer 122 and the sacrificial insulation layer 124 are etched to form storage node receiving openings. The receiving openings are embedded with doped poly-silicon to form a conductive layer, and the resultant conductive layer is flattened by means of chemical mechanical polishing (CMP) or other etching processes, forming storage node electrodes 126.

In this way, according to the present invention, through the use of the crescent-shaped masks for forming the contact holes to be embedded with the landing plugs, the resultant landing plugs, to be connected with the bit lines, are offset from the other landing plugs, to be connected with the storage node contacts, by a certain distance, rather than being aligned linearly. Thereby, each landing plug is able to have a sufficient critical dimension even if the landing plug contact hole is etched so as to slope in a vertical direction.

Therefore, as shown in FIG. 4, under the assumption that each active region between both adjacent inactive regions has a width A, the landing plug 112 comes into contact with the active region over a width C, while only a minor width B remains in a no-contact state. This consequently increases the critical dimension in a lower surface of the landing plug in contact with the active region, and thus achieves good contact ability between the active region and the bit line or storage node contact.

As apparent from the above description, the present invention provides a crescent-shaped mask for forming a landing plug contact hole. When the crescent-shaped mask is used to etch a contact hole, that will be embedded with a landing plug to be vertically connected with a bit line or storage node contact, it is possible to increase the critical dimension at a lower end of the resultant contact hole in contact with an active region of a semiconductor substrate, thereby enabling exposure of a wider area of the active region to be connected with the bit line or storage node contact.

Forming the contact hole of the landing plug with such an increased critical dimension allows the landing plug, to be connected with the bit line or storage node contact, to occupy a wider active region as compared to the prior art, resulting in a low resistance of the landing plug.

Such a low reduction of the landing plug has the effect of improving properties of a transistor, thereby achieving a desired threshold voltage margin of the transistor, an outstanding refresh effect and an enhanced operational speed of a semiconductor device.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A mask for forming landing plug contact holes to vertically expose bar type active regions of a semiconductor substrate to bit line contacts or storage node contacts, wherein the mask has plural pairs of landing plug contact patterns arranged, wherein the pattern has a crescent bowed shape having an outwardly shifted and protruded middle portion, and the respective pair of the patterns are positioned to be facing each other so that the respective outwardly shifted and protruded middle portions are directed to the respective outward directions to form an inner space having a cross (+) shape;

wherein a central part of the inner space having a cross (+) shape formed by the patterns facing each other is a region that a bit line contact is to be formed, and both side parts of the inner space having a cross (+) shape formed by the patterns facing each other are regions that storage node contacts are to be formed; and wherein the region that a bit line contact is to be formed is opened wider than the regions that storage node contacts are to be formed.

2. A method of forming landing plugs in an inter-insulation layer comprising:

forming the inter-insulation layer throughout an upper surface of a semiconductor substrate where certain semiconductor diodes are defined;

forming contact holes in the inter-insulation layer by means of masks to vertically expose active regions of the semiconductor substrate, wherein the mask has plural pairs of landing plug contact patterns arranged, wherein the pattern has a crescent bowed shape having a outwardly shifted and protruded middle portion, and the respective pair of the patterns are positioned to be faced each other so that the respective outwardly shifted and protruded middle portions are directed to the respective outward directions to form an inner space having a cross (+) shape, wherein a central part of the inner space having a cross (+) shape formed by the patterns facing each other is a region that a bit line contact is to be formed, and both parts of the inner space having a cross (+) shape formed by the patterns facing each other are regions that storage node contacts are to be formed, wherein the region that a bit line contact is to be formed is opened wider than the regions that storage node contacts are to be formed; and gap-filling a conductive layer in the landing plug contact holes and flattening the conductive layer, thereby forming landing plugs for embedding the contact holes to vertically connect the active regions with the bit lines or storage node contacts.

3. The method as set forth in claim 2, wherein each of the masks has a crescent bowed shape such that one of the contact holes, associated with a bit line, is offset from the other contact holes, located at opposite sides thereof and associated with the storage node contacts, by a distance.

4. The method as set forth in claim 2, wherein, after forming the landing plug contact holes, the inter-insulation layer is washed to increase the critical dimension of each landing plug contact hole.

* * * * *